(12) United States Patent
Takeuchi (10) Patent No.: US 6,923,407 B2
(45) Date of Patent: Aug. 2, 2005

(54) FIXING TOOL

(75) Inventor: Yasuichi Takeuchi, Tokyo (JP)

(73) Assignee: Takeuchi Industrial Co., Ltd., Tokyo (JP)

( * ) Notice: Subject to any disclaimer, the term of this patent is extended or adjusted under 35 U.S.C. 154(b) by 0 days.

(21) Appl. No.: 10/418,812

(22) Filed: Apr. 19, 2003

(65) Prior Publication Data

US 2003/0213876 A1 Nov. 20, 2003

(30) Foreign Application Priority Data

May 14, 2002 (JP) ......................................... 2002-138133

(51) Int. Cl.$^7$ ........................... H02G 3/32; F16B 21/04; F16L 3/08
(52) U.S. Cl. ........................ 248/73; 248/74.1; 248/68.1; 24/458
(58) Field of Search ........................... 248/68.1, 71, 73, 248/74.1, 74.2, 316.5, 316.7, 222.52; 24/289, 297, 458, 505

(56) References Cited

U.S. PATENT DOCUMENTS

| | | | | |
|---|---|---|---|---|
| 3,252,677 A | * | 5/1966 | Raymond ................... | 248/68.1 |
| 3,811,154 A | * | 5/1974 | Lindeman et al. ............ | 24/326 |
| 4,669,688 A | * | 6/1987 | Itoh et al. ................... | 248/74.2 |
| 4,781,488 A | * | 11/1988 | Hayashi ................... | 403/408.1 |
| 5,794,901 A | * | 8/1998 | Sigel ...................... | 248/221.11 |
| 6,209,827 B1 | * | 4/2001 | Kawai .......................... | 248/73 |
| 6,371,419 B1 | * | 4/2002 | Ohnuki ....................... | 248/74.2 |
| 6,641,093 B2 | * | 11/2003 | Coudrais ...................... | 248/73 |

FOREIGN PATENT DOCUMENTS

| | | | |
|---|---|---|---|
| GB | 2142376 A | * | 1/1985 |
| JP | 2001-082427 | | 3/2001 |
| JP | 2001-278329 | | 10/2001 |
| JP | 2002021831 A | * | 1/2002 |

* cited by examiner

*Primary Examiner*—Jonathon Szumny
(74) *Attorney, Agent, or Firm*—Michael Best & Friedrich LLP (57) ABSTRACT

A fixing tool fixes and supports an electronic component on a board, and includes a fixing portion to be mounted on the board. The fixing portion has a post, an engaging piece formed at a distal end of the post and extending in a direction perpendicular to a projecting direction of the post, a wing piece extending from a proximal end of the post in two outward directions perpendicular to the projecting direction of the post, and an engaging projecting portion formed to project at a distal end portion of the wing piece. The engaging piece is inserted in a mounting hole formed in the board and abuts against a lower surface of the board when being rotated along an upper surface of the board. The wing piece abuts against the upper surface of the board to clamp the board together with the engaging piece. The engaging projecting portion is fitted in the mounting hole, when being located at a rotational position, to lock rotation of the fixing portion.

3 Claims, 10 Drawing Sheets

WHEN PRODUCT IS FIXED (AFTER ROTATION)

FIXING TOOL

BACKGROUND OF THE INVENTION

The present invention relates to a fixing tool used to mount an electronic component, a cable, or the like on a board for an electronic device or the like and, more particularly, to a fixing tool which performs fixing by utilizing a mounting hole formed in the board.

When assembling an electronic device, electronic components must be mounted on an assembly board such as a panel, chassis, board, or the like (which will be referred to as a board hereinafter), and an interconnecting component such as a cable must be extended on the board. A fixing tool is used for this purpose. In recent years, regarding home electrical appliances, OA devices, automobiles, and electronic devices as a whole, marketing of products that are friendly to the environment is obliged as a solution to the environmental issues. Along with this demand, the fixing tool must be able to be disassembled from the board. Particularly, to facilitate the disassembling operation, the fixing tool must be to disassembled easily without using any tools. For this purpose, regarding the structure of the fixing tool of this type, a fixing tool which is to be fitted in a hole formed in the board by utilizing its elastic force has been proposed. If the fixing tool is fitted merely by utilizing its elastic force, when an external force larger than the elastic force is applied to it, the fixing tool may undesirably drop from the board.

Figure 14A:
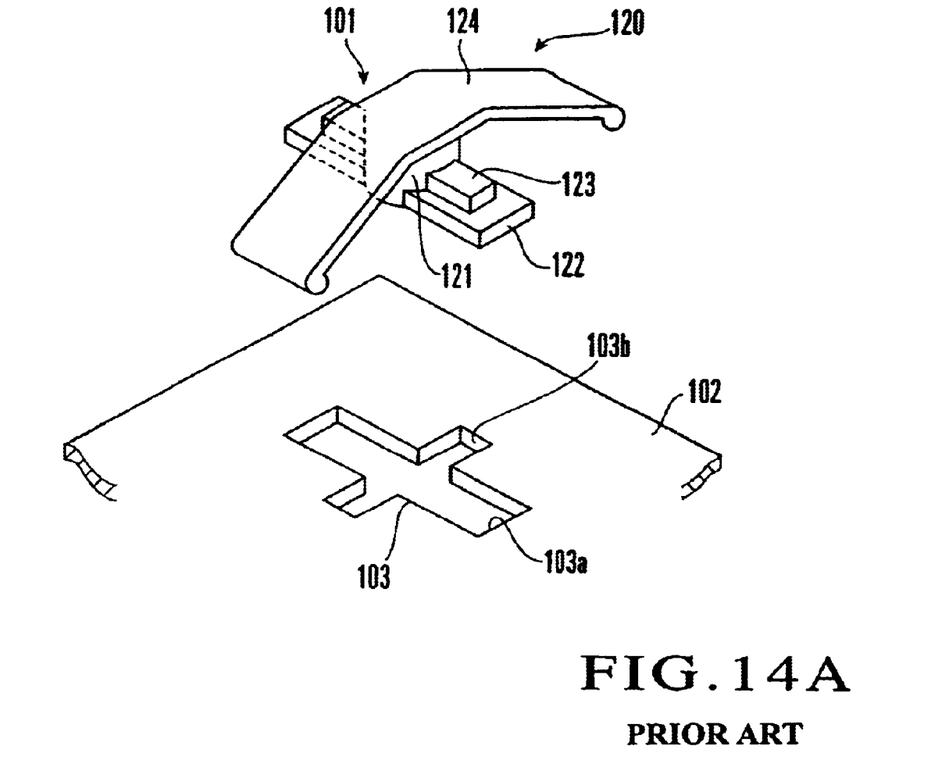
FIGS. 14A and 14B are a perspective view and sectional view, respectively, of an example of a conventional fixing tool.

In order to prevent this dropping of the fixing tool, a fixing tool has been proposed which is fitted in a hole, is then rotated through 90° along the surface of the board, so that it is locked. For example, Japanese Patent Laid-Open No. 2001-82427 proposes a fixing tool 101 as shown in FIG. 14A. In this fixing tool 101, a crisscross mounting hole 103 having a thick notched portion 103a and thin notched portion 103b is formed in a plate member 102. A fixing portion 120 has a wide locking projecting piece 122 and narrow engaging portion 123 that are stacked at the distal end of a leg portion 121 which is to be inserted in the mounting hole 103. A pressing wing portion 124 is formed at the proximal end of the leg portion 121 in a direction perpendicular to the locking projecting piece 122. After the locking projecting piece 122 of the fixing tool 101 is inserted to the lower surface side of the plate member 102 through the thick notched portion 103a, the fixing tool 101 is rotated through 90° along the surface of the plate member 102. Thus, an elastic force is generated as the pressing wing portion 124 abuts against the surface of the plate member 102, causing the locking projecting piece 122 and the engaging portion 123 above it to be fitted in the thin notched portion 103b. Since the plate member 102 is clamped by the locking projecting piece 122 and pressing wing portion 124, the fixing tool 101 can be mounted. In this mounting state, engagement of the locking projecting piece 122 and thin notched portion 103b prevents the fixing tool 101 from disengaging from the plate member 102 by merely pulling the fixing tool 101 to the upper surface side of the plate member 102.

Figure 14B:
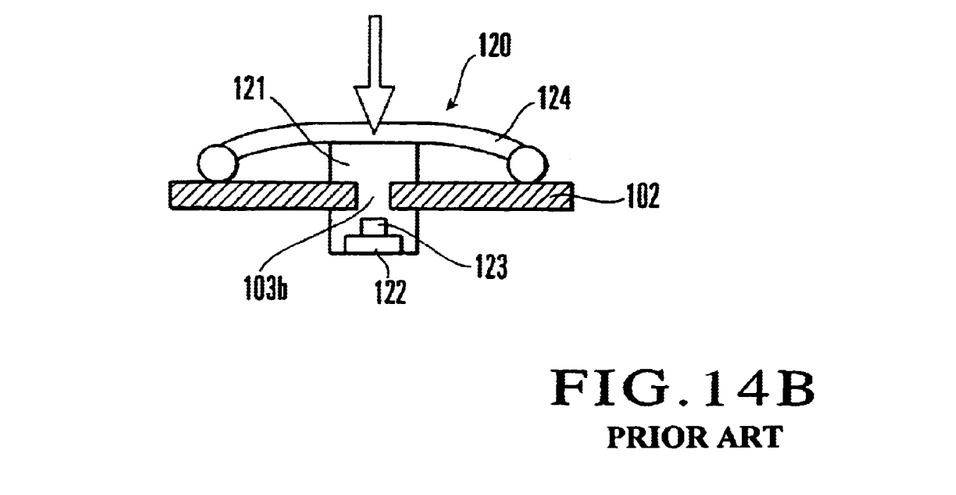

According to the studies by the inventor of the present application, the fixing tool described in this reference has the following problem. More specifically, as shown in FIG. 14B, when an external force that flexes the pressing wing portion 124 is applied to press the fixing tool 101 to the lower surface side of the plate member 102, the locking projecting piece 122 and engaging portion 123 may be undesirably pushed down to below the thin notched portion 103b and be disengaged from it. In this case, when a force in a rotating direction is applied to the fixing tool 101, the locking projecting piece 122 and engaging portion 123 cannot engage with the thin notched portion 103b again. Hence, in this state, the rotational position of the fixing tool 101 is gradually changed by the force in the rotating direction applied to the fixing tool 101. When the locking projecting piece 122 and engaging portion 123 are rotated to correspond to the thick notched portion 103a, the fixing tool 101 is undesirably removed from the mounting hole 103. Therefore, the fixing tool of this reference is not necessarily satisfactory in terms of removal prevention.

SUMMARY OF THE INVENTION

It is an object of the present invention to provide a fixing tool which can be mounted to and disengaged from a board easily and which is prevented from undesirably removing from the board.

In order to achieve the above object, according to the present invention, there is provided a fixing tool for fixing and supporting an electronic component on a board, comprising a fixing portion to be mounted on the board, the fixing portion having a post, an engaging piece formed at a distal end of the post and extending in a direction perpendicular to a projecting direction of the post, a wing piece extending from a proximal end of the post in two outward directions perpendicular to the projecting direction of the post, and an engaging projecting portion formed to project at a distal end portion of the wing piece, wherein the engaging piece is inserted in a mounting hole formed in the board and abuts against a lower surface of the board when being rotated along an upper surface of the board, the wing piece abuts against the upper surface of the board to clamp the board together with the engaging piece, and the engaging projecting portion is fitted in the mounting hole, when being located at a rotational position, to lock rotation of the fixing portion.

DESCRIPTION OF THE PREFERRED EMBODIMENTS

Figure 1:
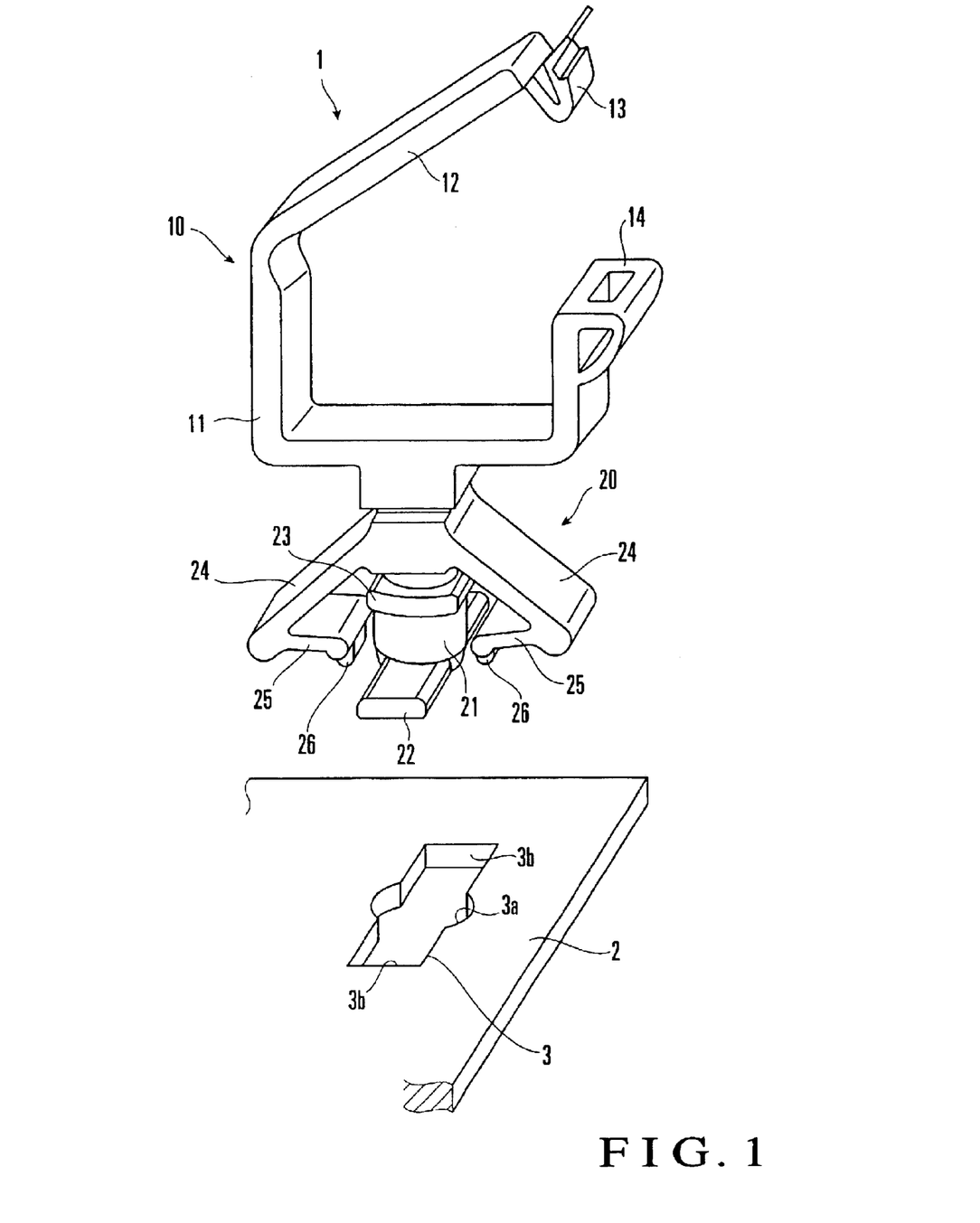
FIG. 1 is a perspective view of the first embodiment in which the present invention is applied to a cable clamp.

The embodiments of the present invention will be described with reference to the accompanying drawings. FIG. 1 shows the first embodiment in which a fixing tool according to the present invention is applied to a locking wire saddle type cable clamp (to be merely referred to as cable clamp hereinafter). A cable clamp 1 is comprised of a clamp portion 10 for holding a plurality of cables C in a bundle, and a fixing portion 20 integral with the clamp portion 10 and to be fitted in a mounting hole 3 formed in a board 2. The cable clamp 1 is formed integrally by resin molding or the like. In the clamp portion 10, a cover piece 12 is connected to an upward U-shaped base 11 at its one end through a hinge, and an almost U-shaped locking piece 13 formed at the other end of the cover piece 12 is fitted in a locking portion 14 formed at the other end of the base 11, so that the locking piece 13 is locked by the locking portion 14. The cables (not shown) are inserted in a rectangular ring formed of the base 11 and cover piece 12, and are supported. When the locking piece 13 and locking portion 14 are unlocked and the cover piece 12 is opened and closed, the cables can be inserted or removed.

Figure 2A:
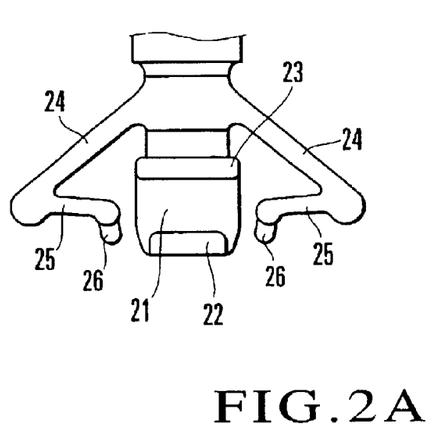
FIGS. 2A to 2C are front, right side, and bottom views, respectively, of a fixing portion.
Figure 2B:
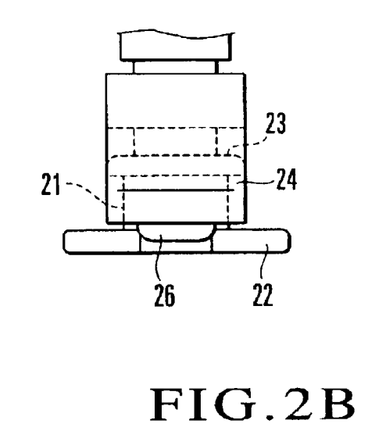
Figure 2C:
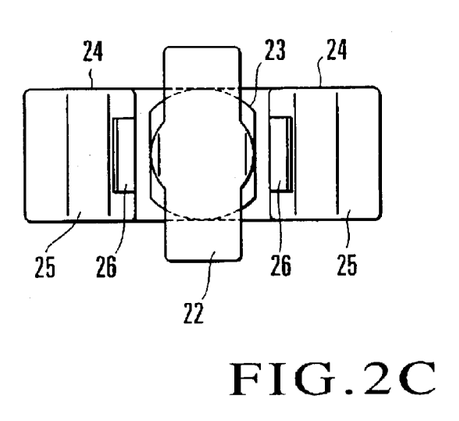

As shown in FIGS. 2A to 2C, the fixing portion 20 has an almost cylindrical post 21 projecting downward, and an elongated thin plate-like engaging piece 22 at the distal end of the post 21 to extend from the two sides of the post 21 in a direction perpendicular to the projecting direction of the post 21. The post 21 also has, at a position close to its proximal portion, an almost circular plate-like stopper 23 having two linearly notched sides, which spreads outward from the circumference of the post 21 and has a diameter larger than that of the post 21. The post 21 also has, at its proximal portion, a pair of wing pieces 24 extending in a direction perpendicular to the extending direction of the engaging piece 22 and spreading in the two directions in a tilted state toward the distal end of the post 21. Distal end portions 25 of the wing pieces 24 are respectively bent back inward to extend to regions close to the post 21, and have engaging projecting portions 26 projecting downward from the lower surfaces of their distal ends. When the engaging projecting portions 26 are observed regarding the axial direction of the post 21, their lower distal end faces are located slightly below the upper surface of the engaging piece 22. Each engaging projecting portion 26 has a width equal to that of the engaging piece 22, and its two side edges in the widthwise direction form shapes close to arcs.

Figure 2D:
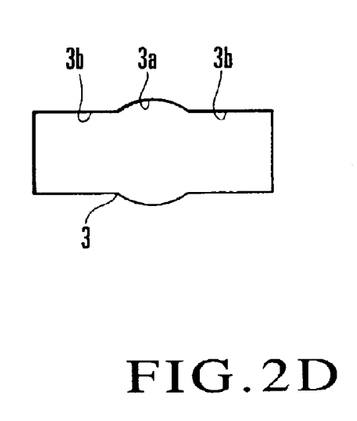
FIG. 2D is a plan view of a mounting hole.

As shown in FIG. 2D, the board 2 where the cable clamp 1 is to be mounted has a mounting hole 3 formed of a central hole portion 3a through which the post 21 of the fixing portion 20 can be inserted, and notched portions 3b which extend toward the two sides of the central hole portion 3a and have widths each almost equal to that of the engaging piece 22, and through which the engaging piece 22 can be inserted.

Figure 3A:
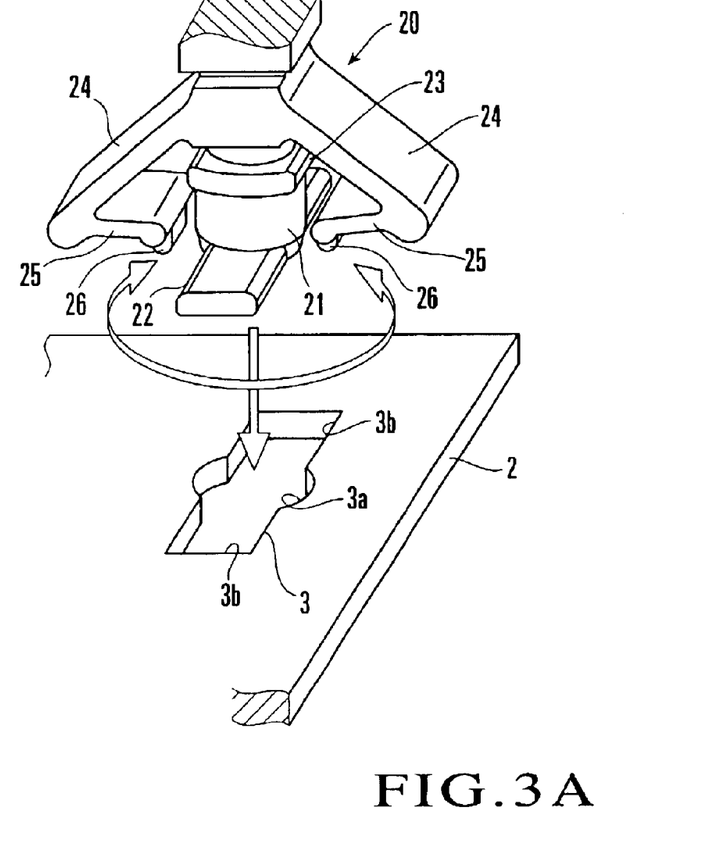
FIGS. 3A and 3B are perspective and sectional views, respectively, showing how to mount the fixing portion on a board.
Figure 3B:
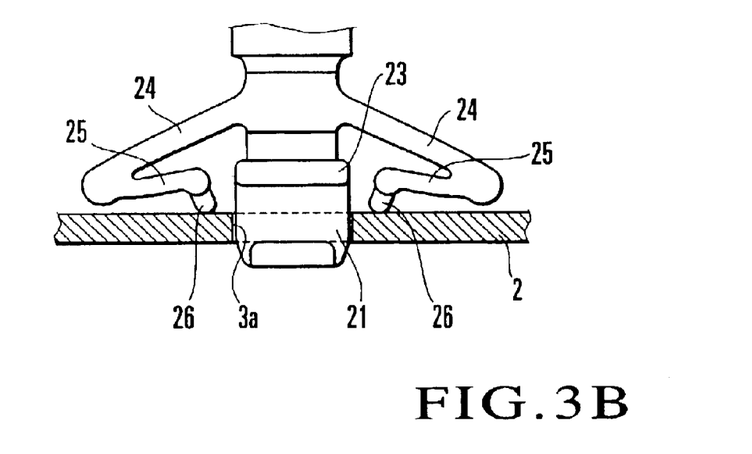
Figure 4:
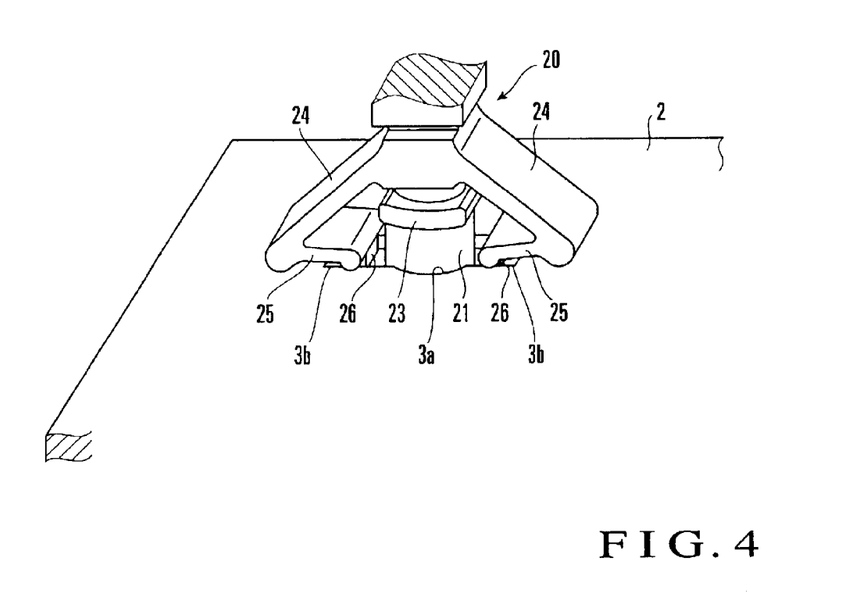
FIG. 4 is a perspective view showing a state wherein the fixing portion is mounted on the board.
Figure 5A:
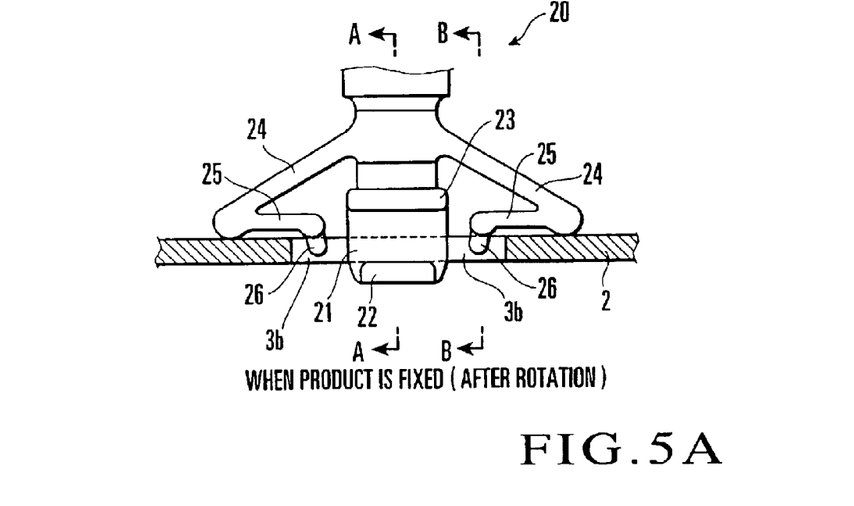
FIG. 5A is a front view showing the state wherein the fixing portion is mounted on the board.
Figure 5B:
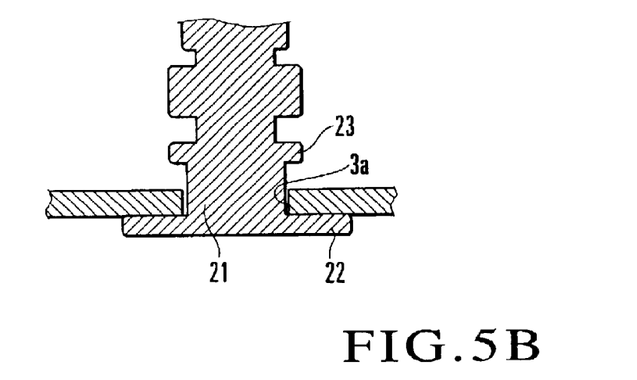
FIG. 5B is a sectional view taken along the line A—A of FIG. 5A.
Figure 5C:
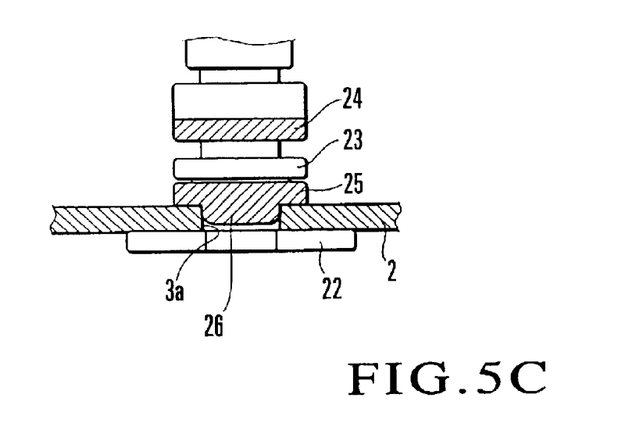
FIG. 5C is a sectional view taken along the line B—B of FIG. 5A.

When the cable clamp 1 with the above arrangement is to be mounted on the board 2, the fixing portion 20 is inserted in the mounting hole 3 of the board 2, as shown in FIGS. 3A and 3B. More specifically, the direction of the engaging piece 22 is set to correspond to the notched portions 3b of the mounting hole 3. As the post 21 is inserted in the mounting hole 3, the wing pieces 24 abut against the upper surface of the board 2. The post 21 is further inserted while elastically deforming the wing pieces 24, until the engaging piece 22 reaches the lower surface side of the board 2. Then, as shown in FIG. 4, the cable clamp 1 (fixing portion 20) is rotated through 900 along the upper surface of the board 2. At this time, since the post 21 is located in the central hole portion 3a of the mounting hole 3, the cable clamp 1 can be rotated, and its rotating direction can be clockwise or counterclockwise. When the cable clamp 1 is rotated through 90°, the two wing pieces 24 are moved to positions where they respectively cover the notched portions 3b, as shown in FIGS. 5A, 5B, and 5C. Since the engaging projecting portions 26 of the distal end portions 25 of the wing pieces 24 have widths that are almost equal to those of the notched portions 3b, they are fitted in the corresponding notched portions 3b and engage with them. After that, when the operating force being applied to the fixing portion 20 is removed, the fixing portion 20 is moved to the upper surface side of the board 2 by the elastic restoration force of the wing pieces 24, and the engaging piece 22 is elastically abutted against the lower surface of the board 2 by the elastic restoration force.

In this state, in the fixing portion 20, the board 2 is clamped between the engaging piece 22 abutting against the lower surface of the board 2 and the wing pieces 24 abutting against the upper surface of the board 2. This clamping force mounts the fixing portion 20, i.e., the cable clamp 1, on the board 2. In this state, the engaging projecting portions 26 at the distal end portions 25 of the wing pieces 24 are fitted in the notched portions 3b and engage with them. This engaging state is held by the elastic force of the wing pieces 24. Hence, unless an external force larger than the elastic force is applied, the wing pieces 24, i.e., the fixing portion 20, is prevented from rotating along the upper surface of the board 2. When the cable clamp 1 receives an external force, it will not be rotated easily, and the engaging piece 22 will not be rotated to correspond to the positions of the notched portions 3b, so the fixing portion 20 will not disengage from the board 2. In particular, when an external force toward the lower surface side of the board 2 is applied to the fixing portion 20, the force with which the wing pieces 24 abut against the upper surface of the board 2 increases on the contrary. The engaging projecting portions 26 engage with the notched portions 3b in a firmer state, so the fixing portion 20 will not be removed from the board 2. Therefore, the cable clamp 1 will not be rotated by vibration, impact, or the like applied to it. In this case, since the stopper 23 formed at the proximal end of the post 21 abuts against the upper surface of the board 2, the fixing portion 20 is limited from being pushed into the lower surface side of the board 2. Thus, the wing pieces 24 can be avoided from being applied with a large force, and will not be damaged.

When the cable clamp 1 is to be disengaged from the board 2, a force that rotates the fixing portion 20 through 90° clockwise or counterclockwise along the upper surface of the board 2 is applied. Then, as the two side edges of each engaging projecting portion 26 have almost arc shapes, the engaging projecting portions 26 ride over the two side edges of the notched portions 3b and are moved to the outside of the notched portions 3b, i.e., onto the upper surface of the board 2. Thus, the fixing portion 20 can be rotated through 90° comparatively easily. When the fixing portion 20 is rotated through 90°, the engaging piece 22 is pivoted to reach the position corresponding to the notched portions 3b. Then, when the fixing portion 20 is pulled up to the upper surface side of the board 2, the engaging piece 22 runs through the mounting hole 3, and the cable clamp 1 can be disengaged from the board 2.

Figure 6:
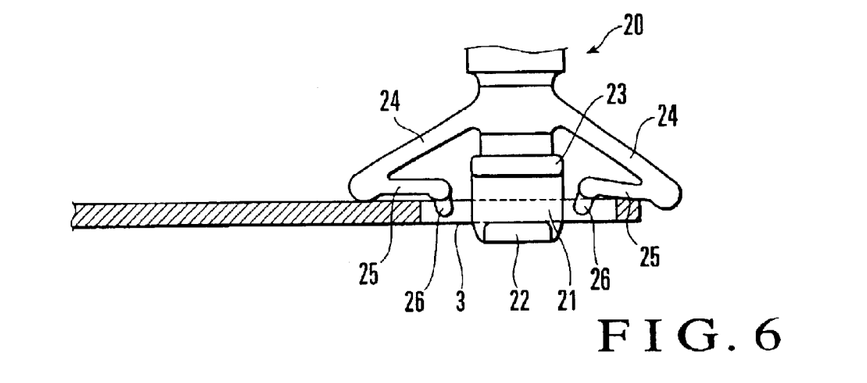
FIG. 6 is a sectional view showing a different mounting state of a fixing tool of the present invention.

As described above, with the fixing portion 20 applied to the cable clamp 1, when an external force is applied to the fixing portion 20 to push it into the board 2, the fixing portion 20 will not disengage from the board 2 at all, but rather the engaging state is enhanced. Unlike in the prior art, the fixing portion 20 will not be removed from the board 2 due to an external force. As the stopper 23 formed on the post 21 limits the push-in amount of the fixing portion 20, uncontrolled push-in operation will not break the wing pieces 24, unlike in the prior art. As shown in FIG. 6, even when the mounting hole 3 is formed at a position close to an end of the board 2, since the distal end portions 25 of the wing pieces 24 extend to be bent back inward, one wing piece 24 abuts against the edge of the board 2 with its distal end portion 25, so that the operation of the elastic force caused by the wing piece 24 can be effected. According to the prior art, the blade portion abuts against the board only with its distal end. If the mounting hole 3 is formed in the edge of the board 2 in this manner, it is difficult to expect the operation of the elastic force of the blade portion. When the shape of the mounting hole 3 is compared to almost the crisscross shape as in the prior art, it is linear and close to a rectangular shape, which is simple. Accordingly, the press molding tool used for forming a mounting hole in the board is also simple, resulting in easy design and manufacture.

Figure 7A:
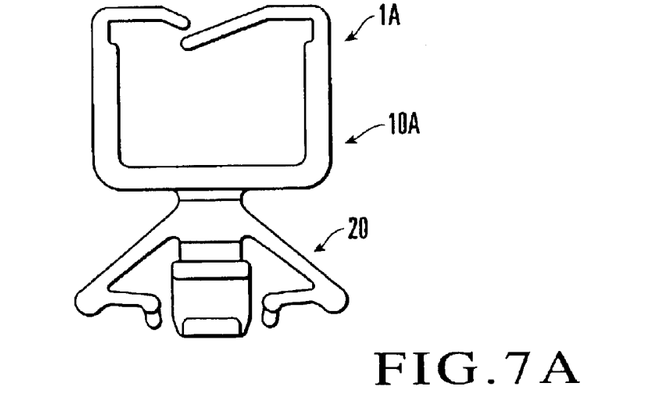
FIGS. 7A and 7B are front views showing an example in which the first embodiment is applied to a different fixing tool.
Figure 7B:
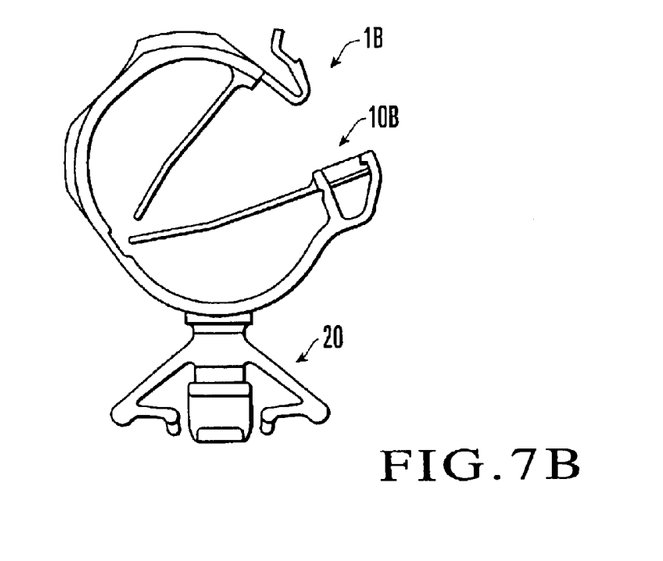
Figure 8A:
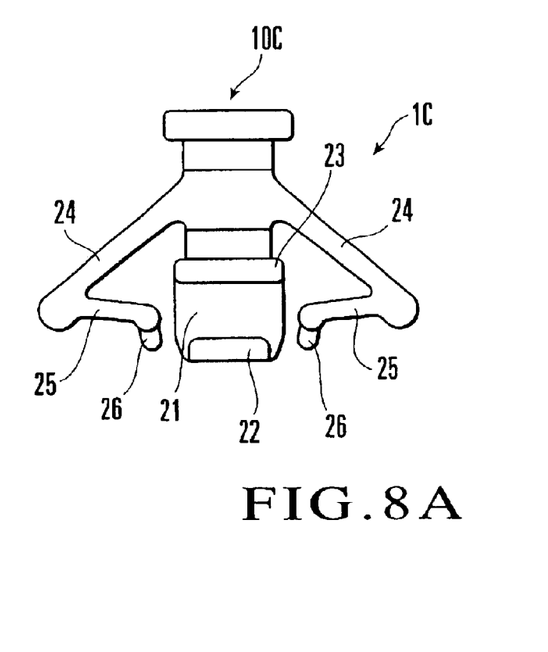
FIGS. 8A and 8B are front views showing an example in which the first embodiment is applied to another different fixing tool.
Figure 8B:
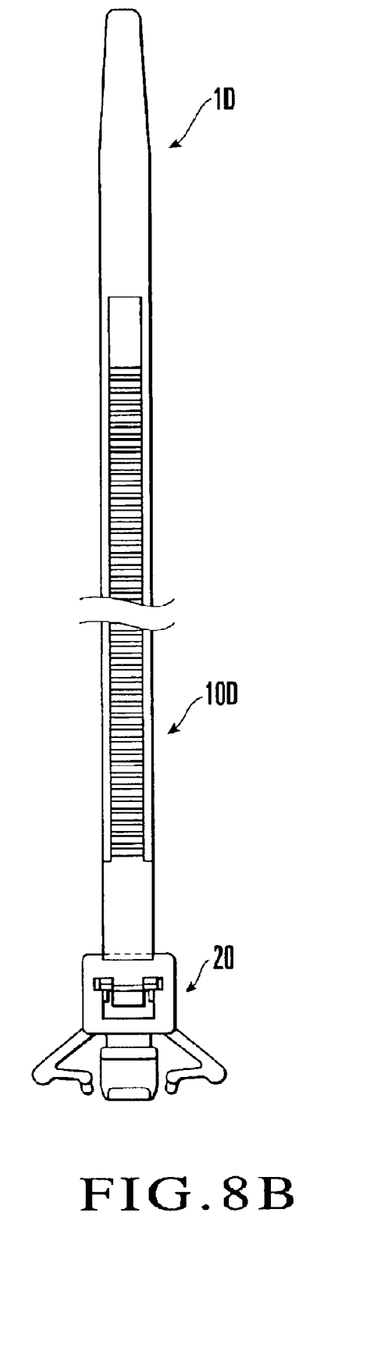

In the above embodiment, the fixing tool according to the present invention is applied to a cable clamp. Alternatively, as shown in FIG. 7A, the present invention may form a fixing portion 20 for a wire saddle type cable clamp 1A having a clamp portion 10A with a pair of tongue pieces in the opening of an upward U-shaped base. As shown in FIG. 7B, the present invention may also form a fixing portion 20 for a locking wire saddle type cable clamp 1B having a circular clamp portion 10B with a pair of cable clamping pieces. Furthermore, as shown in FIG. 8A, the present invention may be applied to a board support 1C having a support portion 10C for supporting a circuit board or the like on a board, or a fixing portion 20 for a binding band 1D having a band portion 10D for clamping a cable which is to extend on a board. The clamp portions of these fixing tools are already known, and a detailed description thereof will accordingly be omitted.

Figure 9:
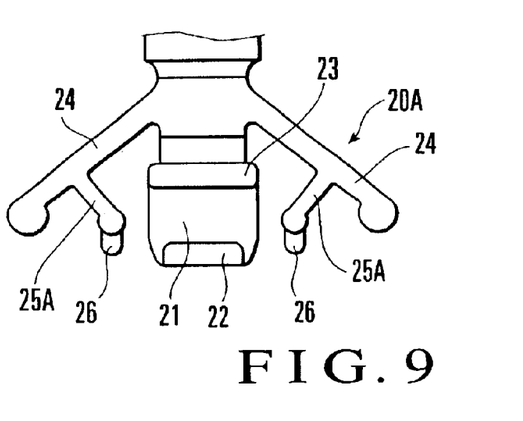
FIG. 9 is a front view of a fixing portion according to a modification of the first embodiment.

Regarding the arrangement of the engaging projecting portion formed on the wing piece, as in a fixing portion 20A shown in FIG. 9, projecting piece portions 25A may be integrally formed to extend inwardly from the inner surfaces of wing pieces 24 at positions slightly backward from the distal ends of the wing pieces 24, and engaging projecting portions 26 may be formed at the distal ends of the projecting piece portions 25A. With this arrangement, the wing pieces 24 can be formed long to maintain a sufficiently long elastic stroke, while the engaging positions of the engaging projecting portions 26 can be set close to a post 21. This can decrease the sizes of the notched portions of the mounting hole, and the lengths of the engaging pieces, so that the fixing portion and the mounting hole can be downsized. This is effective in realizing a compact fixing tool.

Figure 10:
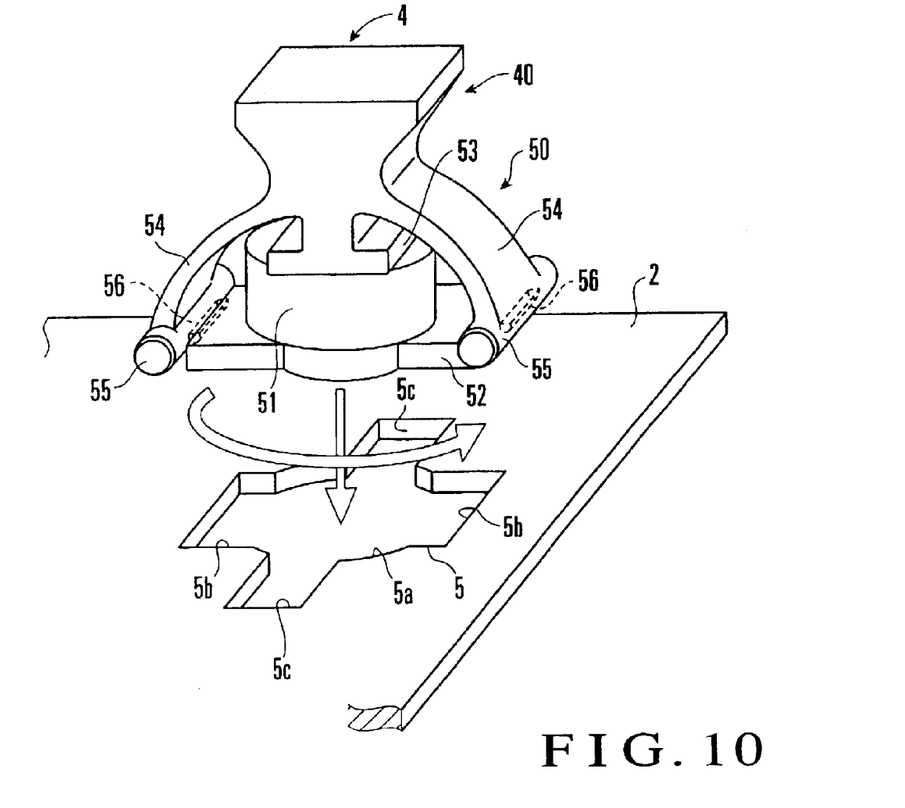
FIG. 10 is a perspective view of the second embodiment in which the present invention is applied to a board support.
Figure 11:
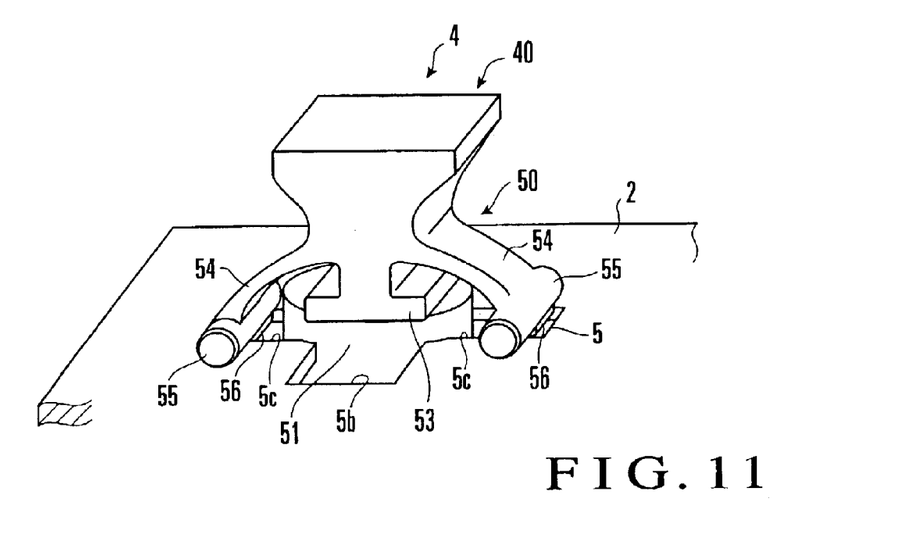
FIG. 11 is a perspective view showing a state wherein the board support according to the second embodiment is mounted on a board.

FIG. 10 shows an example in which the second embodiment of the present invention is applied to a board support. More specifically, a board support 4 is comprised of a support portion 40 having a flat upper end portion for abutting against the lower surface of a circuit board (not shown) supported on a board 2 in order to support the circuit board, and a fixing portion 50 formed at the lower portion of the support portion 40. The arrangement of the fixing portion 50 is basically the same as that of the first embodiment, but is different from the first embodiment in that an engaging piece and wing pieces are formed in the same direction. More specifically, the fixing portion 50 has an elongated thin plate-like engaging piece 52 at the distal end of a downward projecting, almost cylindrical post 51, to extend from the two sides of the post 51 in a direction perpendicular to the projecting direction of the post 51. The post 51 also has, at a position close to its proximal portion, an almost rectangular plate-like stopper 53 which spreads outward from the circumference of the post 51 and has longitudinal and lateral sizes each larger than the diameter of the post 51. The post 51 also has, at its proximal portion, a pair of wing pieces 54 extending in a direction parallel to the extending direction of the engaging piece 52 and spreading in two directions in an arcuate state toward the distal end of the post 51. The distal end portions of the wing pieces 54 have small-diameter cylindrical portions 55 slightly long in the widthwise direction, and engaging projecting portions 56 projecting downward from the lower surfaces of the respective cylindrical portions 55. When the engaging projecting portions 56 are observed regarding the axial direction of the post 51, their lower distal end faces are located slightly below the upper surface of the engaging piece 52. Each engaging projecting portion 56 has a width slightly smaller than that of the engaging piece 52, and its two side edges in the widthwise direction form shapes close to arcs.

As shown in FIG. 10, the board 2 where the board support 4 is to be mounted has an almost crisscross mounting hole 5 formed of a central hole portion 5a through which the post 51 of the fixing portion 50 can be inserted, thick notched portions 5b which extend toward the two sides of the central hole portion 5a and have widths and lengths respectively equal to those of the engaging piece 52 and through which the engaging piece 52 can be inserted, and thin notched portions 5c which extend in a direction perpendicular to the thick notched portions 5b toward the two sides of the central hole portion 5a and have a length smaller than the width of the engaging piece 52, almost equal to the widths of the engaging projecting portions 56, and almost equal to the distance between the two opposing engaging projecting portions 56.

Figure 12A:
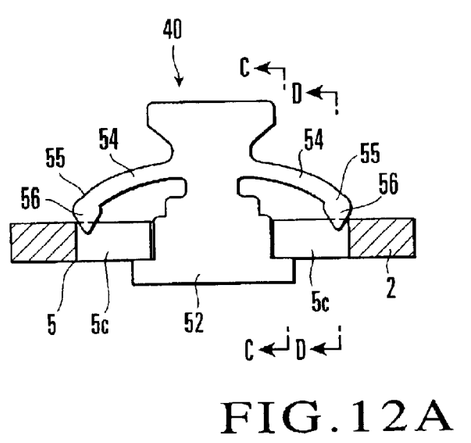
FIG. 12A is a front view showing a state wherein the board support according to the second embodiment is mounted on a board.
Figure 12B:
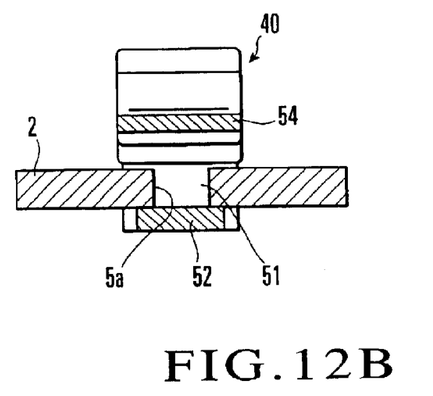
FIG. 12B is a sectional view taken along the line C—C of FIG. 12A.
Figure 12C:
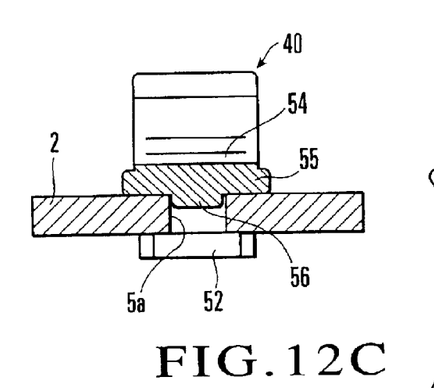
FIG. 12C is a sectional view taken along the line D—D of FIG. 12A.

The board support 4 with the above arrangement can be mounted on the board 2 with operation almost identical to that of the first embodiment. More specifically, the engaging piece 52 is set to correspond to the positions of the thick notched portions 5b of the mounting hole 5, and the post 51 is inserted in the central hole portion 5a of the mounting hole 5. Then, the post 51 is further inserted while elastically deforming the wing pieces 54, until the engaging piece 52 reaches the lower surface side of the board 2. Then, when the board support 4 (fixing portion 50) is rotated through 900 along the upper surface of the board 2, the engaging piece 52 and wing pieces 54 are moved to positions where they respectively cover the thick notched portions 5c, and then the engaging projecting portions 56 of the wing pieces 54 are respectively fitted in the thin notched portions 5c and engage with them, as shown in FIGS. 12A to 12C. When the operating force being applied to the fixing portion 50 is removed, the engaging piece 52 is elastically abutted against the lower surface of the board 2, in regions around the thin notched portions 5c, by the elastic restoration force of the wing pieces 54.

Hence, in the fixing portion 50, the board 2 is clamped between the engaging piece 52 abutting against the lower surface of the board 2 and the wing pieces 54 abutting against the upper surface of the board 2. This clamping force mounts the board support 4 on the board 2. In this state, the engaging projecting portions 56 of the wing pieces 54 engage in the notched portions 5c. Hence, the wing pieces 54 and hence the fixing portion 50 are prevented from rotating along the upper surface of the board 2. When the board support 4 receives an external force, it will not be rotated easily, and the engaging piece 52 will not be rotated to correspond to the positions of the thick notched portions 5b, so the fixing portion 50 will not disengage from the board 2. In this case, when an external force toward the lower surface side of the board 2 is applied to the fixing portion 50, the force with which the wing pieces 54 abut against the upper surface of the board 2 increases on the contrary. The engaging projecting portions 56 engage with the thin notched portions 5c in a firmer state, so the fixing portion 50 will not be removed from the board 2. Since the stopper 53 formed at the proximal end of the post 51 limits the fixing portion 50 from being pushed into the lower side of the board 2, the wing pieces 54 can be avoided from being applied with a large force, and will not be damaged.

When the board support 4 is to be disengaged from the board 2, it is done in the same manner as in the first embodiment, and a force that rotates the fixing portion 50 through 900 clockwise or counterclockwise along the upper surface of the board 2 is applied. Then, as the two side edges of each engaging projecting portion 56 have almost arc shapes, the engaging projecting portions 56 ride over the two side edges of the thin notched portions 5c and are moved to the positions of the thick notched portions 5b. These positions are where the engaging piece 52 corresponds to the thick notched portions 5b. When the fixing portion 50 is pulled up to the upper surface side of the board 2, the engaging piece 52 can be disengaged from the mounting hole 5 through the thick notched portions 5b.

Figure 13:
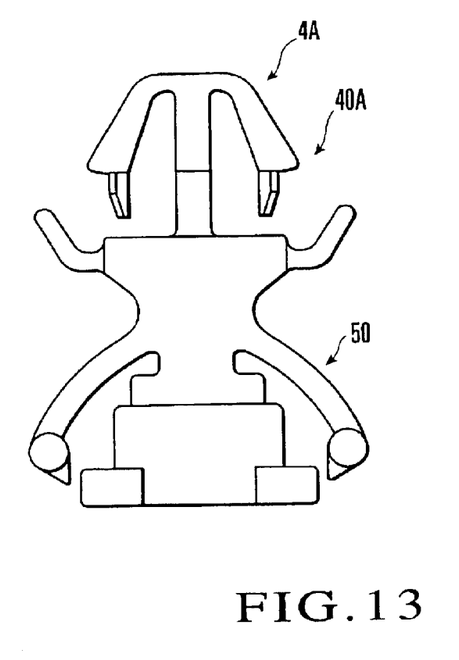
FIG. 13 is a front view showing an example in which the second embodiment is applied to a different fixing tool.

Regarding the fixing portion 50 of the second embodiment, it can be employed as a fixing portion 50 for a locking board support 4A having a locking portion 40A which fits in a through hole formed in a circuit board to be supported, as shown in FIG. 13. Naturally, the fixing portion 50 of the second embodiment can also be similarly applied to the respective fixing tools shown in FIGS. 7A and 7B, and 8A and 8B of the first embodiment.

As has been described above, the fixing tool according to the present invention has an engaging piece which is inserted through a mounting hole formed in a board, and is rotated to abut against the lower surface of the board, and engaging projecting portions, at distal end portions of wing pieces that abut against the upper surface of the board to clamp the board together with the engaging piece, which are to be fitted in the mounting hole. Thus, the fixing tool can be mounted on the board by only inserting the engaging piece in the mounting hole and rotating the fixing tool, and can be disengaged from the board by only rotating the fixing tool with some force. Mounting and disengagement of the fixing tool are thus facilitated. When a force is applied to the fixing portion to separate it from the board, the fixing tool is not disengaged by abutment of the engaging piece and the board. Conversely, when an external force is applied to the fixing portion to push it into the board, the engaging projecting portions will not disengage from the notched portions, and the fixing tool will not disengage from the board when it is rotated.

What is claimed is:

1. A fixing tool for fixing and supporting an electronic component on a board that has a mounting hole, a lower surface and an upper surface, said fixing tool comprising:

a post;

an engaging piece formed at a distal end of said post and extending in a direction perpendicular to a projecting direction of said post;

a wing piece extending from a proximal end of said post in two outward directions perpendicular to the projecting direction of said post; and an engaging projecting portion formed to project at distal end portions of said wing piece, the engaging projecting portion including first portions coupled with and extending from the distal end portions in two inward directions toward the post and second portions coupled with and projecting generally downward from a lower surface of the first portion proximate the post, wherein said engaging piece is adapted to be inserted in a mounting hole formed in the board and is adapted to abut against a lower surface of the board when being rotated, said wing piece is adapted to abut against the upper surface of the board to clamp the board together with said engaging piece, and said second portion is adapted to be fitted in the mounting hole, when being located at a rotational position to lock rotation of said fixing tool.

2. The tool according to claim 1, wherein said engaging piece and said wing piece extend in different directions that form an angle of 90° with respect to a rotating direction of said engaging piece.

3. A tool according to claim 1, wherein said engaging piece and said wing piece extend in one direction, and the mounting hole has a crisscross shape formed of a thick notched portion through which said engaging piece can be inserted, and a thin notched portion through which said engaging projecting portion can be fitted, said thick and thin notched portions extending in directions forming an angle of 90°.

* * * * *